(12) United States Patent
Singh et al.

(10) Patent No.: US 6,245,493 B1
(45) Date of Patent: Jun. 12, 2001

(54) METHOD FOR REDUCING SURFACE REFLECTIVITY BY INCREASING SURFACE ROUGHNESS

(76) Inventors: Bhanwar Singh, 17122 Heatherwood, Morgan Hill, CA (US) 95037; Bharath Rangarajan, 2295 Dolores Ave.; Sanjay K. Yedur, 444 Saratoga Ave. #27A, both of Santa Clara, CA (US) 95050; Michael K. Templeton, 80 Palmer La., Atherton, CA (US) 94027; Christopher F. Lyons, 42681 Lerwick St., Fremont, CA (US) 94539

( * ) Notice: Subject to any disclaimer, the term of this patent is extended or adjusted under 35 U.S.C. 154(b) by 0 days.

(21) Appl. No.: 09/205,738

(22) Filed: Dec. 4, 1998

(51) Int. Cl.$^7$ ........................................................ G03F 7/00
(52) U.S. Cl. .................... 430/327; 430/311; 430/313; 216/52; 216/67
(58) Field of Search .................. 430/311, 313, 430/327; 216/52, 67

(56) References Cited

U.S. PATENT DOCUMENTS

| | | |
|---|---|---|
| 5,139,974 | * 8/1992 | Sandhu ................................ 437/228 |
| 5,597,754 | 1/1997 | Lou et al. ............................... 437/52 |
| 5,688,550 | 11/1997 | Weimer et al. ........................... 427/8 |
| 5,691,228 | 11/1997 | Ping et al. .............................. 437/60 |
| 5,824,603 | * 10/1998 | Cho ...................................... 438/725 |
| 5,888,908 | * 3/1999 | Stagaman ............................... 438/720 |

FOREIGN PATENT DOCUMENTS 62-143846  *  6/1987  (JP) .
63-14190   *  1/1988  (JP) .

OTHER PUBLICATIONS

"Limiting Reflectivity in Al–Cu Films", IBM Technical Disclosure Bulletin, NN 79054832, abstract, May 1979.*

* cited by examiner

*Primary Examiner*—Mark F. Huff
*Assistant Examiner*—Nicole Barreca
(74) *Attorney, Agent, or Firm*—Amin & Turocy, LLP

(57) ABSTRACT

A method for creating a roughened surface on a material exposed to light during a photolithographic process is provided. The roughened surface is created on a surface of the material via a plasma etch process. The roughened surface diffuses light incident to the material such that the diffused light causes insubstantial damage to a photoresist subsequently formed on the material.

4 Claims, 11 Drawing Sheets

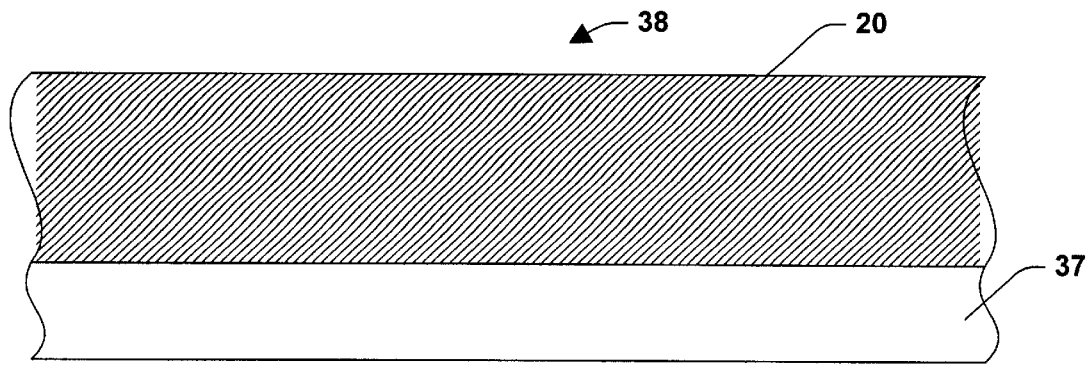
Fig. 2
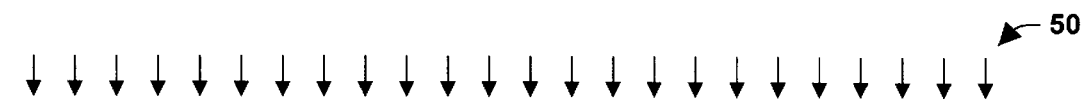
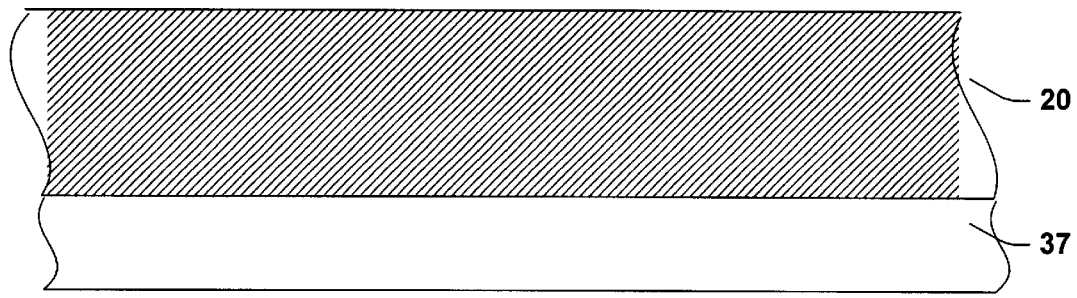
Fig. 3
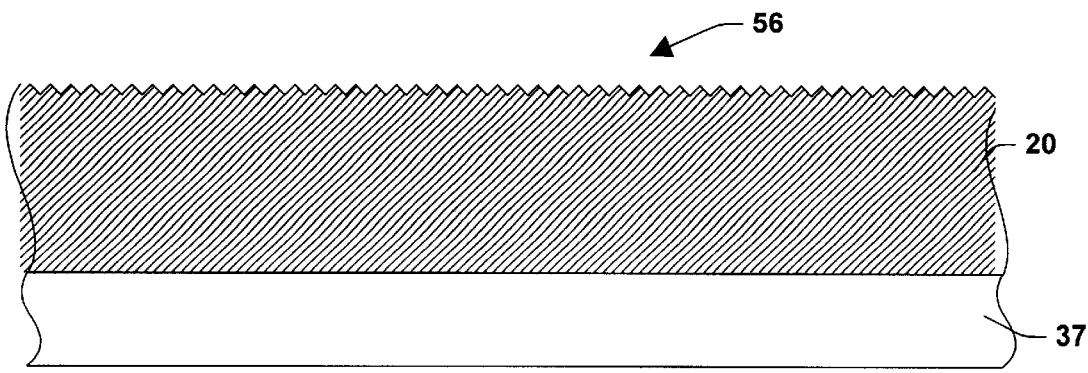
Fig. 4

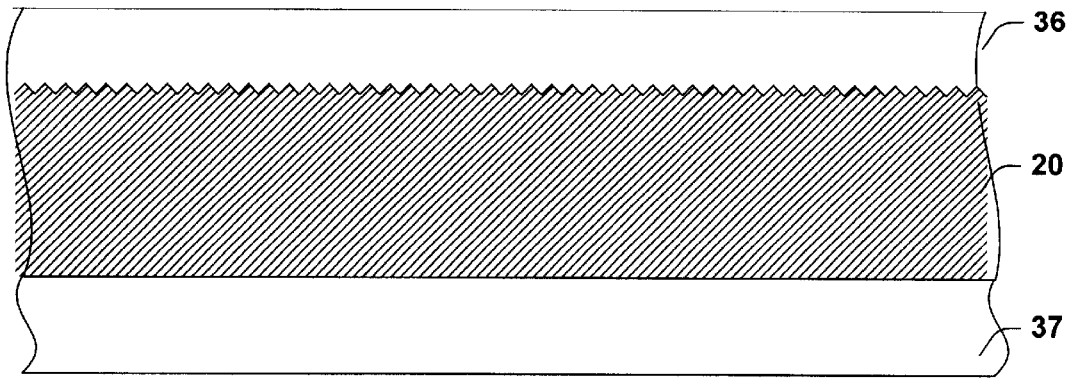
Fig. 5
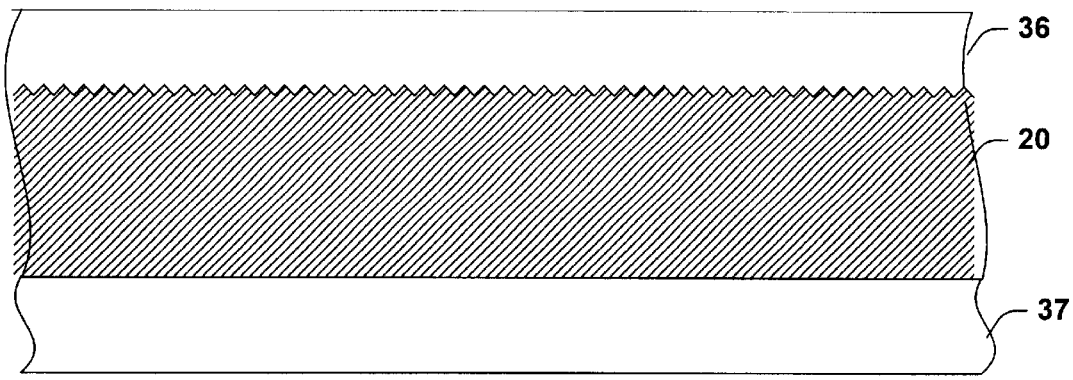
Fig. 6

METHOD FOR REDUCING SURFACE REFLECTIVITY BY INCREASING SURFACE ROUGHNESS

TECHNICAL FIELD

The present invention generally relates to reducing reflectivity of surfaces in order to facilitate lithography.

BACKGROUND OF THE INVENTION

In the semiconductor industry, there is a continuing trend toward higher device densities. To achieve these high densities there has been and continues to be efforts toward scaling down device dimensions at submicron levels on semiconductor wafers. In order to accomplish such high device packing density, smaller and smaller feature sizes are required. This may include the width and spacing of interconnecting lines and the surface geometry such as corners and edges of various features.

The requirement of small features with close spacing between adjacent features requires high resolution photolithographic processes. In general, lithography refers to processes for pattern transfer between various media. It is a technique used for integrated circuit fabrication in which a silicon slice, the wafer, is coated uniformly with a radiation-sensitive film, the resist, and an exposing source (such as optical light, x-rays, or an electron beam) illuminates selected areas of the surface through an intervening master template, the mask, for a particular pattern. The lithographic coating is generally a radiation-sensitive coating suitable for receiving a projected image of the subject pattern. Once the image is projected, it is indelibly formed in the coating. The projected image may be either a negative or a positive of the subject pattern. Exposure of the coating through a photomask causes the image area to become either more or less soluble (depending on the coating) in a particular solvent developer. The more soluble areas are removed in the developing process to leave the pattern image in the coating as less soluble polymer.

Present techniques in optical projection printing can resolve images of sub-micron when photoresists with good linewidth control are used. However, reflection of light from substrate/resist interfaces produce variations in light intensity and scattering of light in the resist during exposure, resulting in non-uniform photoresist linewidth upon development.

Constructive and destructive interference resulting from reflected light is particularly significant when monochromatic or quasi-monochromatic light is used for photoresist exposure. In such cases, the reflected light interferes with the incident light to form standing waves within the resist. In the case of highly reflective substrate regions, the problem is exacerbated since large amplitude standing waves create thin layers of underexposed resist at the wave minima. The underexposed layers can prevent complete resist development causing edge acuity problems in the resist profile.

Antireflective coatings are known and used to mitigate the aforementioned problems, however, the use thereof presents additional problems such as, for example, introduction of particulate contamination, requirement of tight temperature tolerances during production, etc.

SUMMARY OF THE INVENTION

The present invention relates to a method of reducing reflectivity of an underlayer surface to be covered by a resist. The reflectivity of the surface is reduced by roughening (e.g., dulling) the surface so that it is less reflective. Reducing reflectivity of the surface mitigates destructive and constructive interference and standing waves resulting from light reflected therefrom. The surface roughening is accomplished via a plasma etch process to create a plurality of divots (or roughness profile) in the surface. The roughening of the surface makes the surface substantially less reflective. Light incident to the roughened surface is diffused to such a degree that the aforementioned problems associated with resist damage resulting from reflected light is mitigated. Furthermore, the present invention does not require the use of anti-reflective coatings, and thus avoids many of the problems associated with using anti-reflective coatings.

In accordance with one specific aspect of the invention, a method for creating a roughened surface on an underlayer material is provided. The method includes the steps of: roughening the surface of the underlayer via a plasma etch; subsequently forming a photoresist on the underlayer; and exposing the photoresist to light to form a pattern.

Another aspect of the invention relates to a method of mitigating damage to a photoresist formed on an underlayer. The method includes the step of: using an underlayer having a roughened surface which diffuses light incident to the underlayer, the incident light being diffused to such a degree that the diffused beams of light result in insubstantial damage to the photoresist.

Yet another aspect of the present invention relates to an underlayer which mitigates damage to a photoresist layer formed on the underlayer. The underlayer includes a reflective material; and a roughened surface formed on a surface of the underlayer, the roughened surface diffusing light incident to the underlayer so that the diffused light is of an intensity which results in minimal damage to the photoresist, the roughened surface formed via a plasma etch.

In accordance with another aspect of the present invention, a method for creating a roughened surface on an oxide layer is provided. The method includes forming an oxide layer over an underlayer material; creating a roughened surface on a surface of the oxide layer via a plasma etch process; subsequently forming a photoresist on the oxide layer; and exposing the photoresist to light to form a pattern.

Another aspect of the present invention relates to a method for creating a roughened surface on an oxide layer serving as an anti-reflective coating for an underlayer. The method includes the steps of: using a plasma etch process to form the roughened surface, the plasma etch process including using argon as a reactant gas, the roughened surface being tailored to diffuse light incident to the oxide layer such that the diffused light does insubstantial damage to a photoresist formed on the oxide layer.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 2 is a schematic cross-sectional illustration of a reflective underlayer formed on a silicon substrate;

FIG. 3 is a schematic cross-sectional illustration of the underlayer layer of FIG. 2 undergoing a roughening process;

FIG. 4 is a schematic cross-sectional illustration of the underlayer of FIG. 3 after the roughening process is substantially complete;

FIG. 5 is a schematic cross-sectional illustration of a photoresist layer formed on the roughened underlayer of FIG. 4;

FIG. 6 is a schematic cross-sectional illustration of the photoresist layer of FIG. 5 undergoing a patterning process;

DETAILED DESCRIPTION OF THE INVENTION

Figure 1:
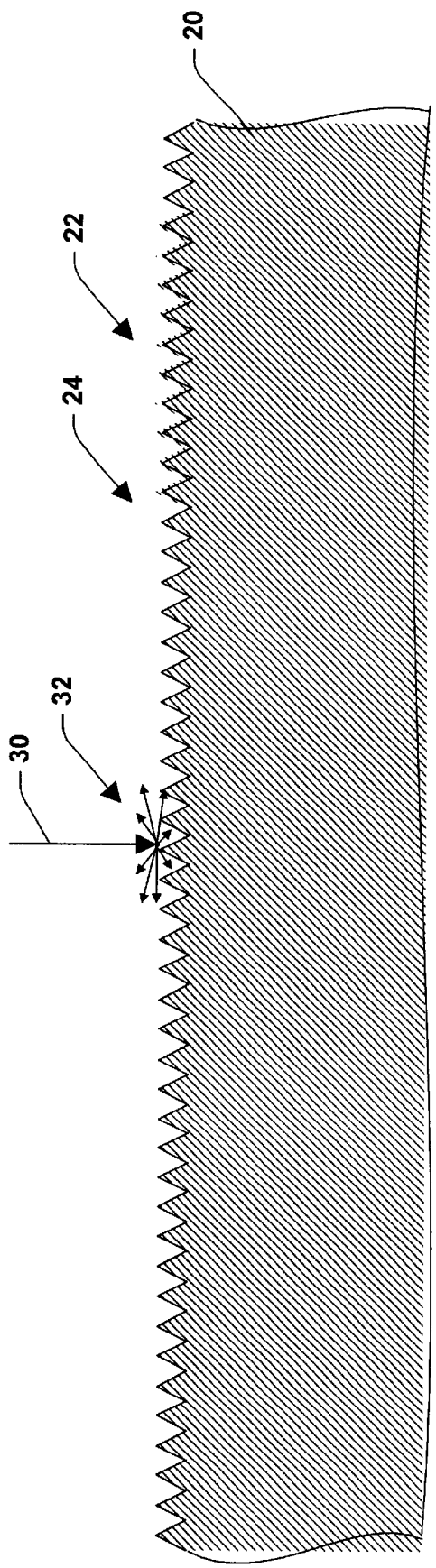
FIG. 1 is a schematic cross-sectional illustration of a portion of an underlayer having its surface roughened to reduce reflectivity thereof in accordance with the present invention.

The present invention will now be described with reference to the drawings, wherein like reference numerals are used to refer to like elements throughout. The method of the present invention will be described with reference to roughening a material so as to reduce reflectivity of a surface thereof. The roughened surface is a non-uniform surface condition resulting from the present invention, wherein light reflected from the roughened surface tends to be scattered/diffused to a degree where the scattered/diffused beams cause insubstantial damage to a photoresist layer formed on the material. The following detailed description is of the best modes presently contemplated by the inventors for practicing the invention. It should be understood that the description of this preferred embodiment is merely illustrative and that it should not be taken in a lIinse.

FIG. 1 is a schemtic illustration of an underlayer 20 having a top surface 22 roughened (or dulled) so as to substantially reduce reflectivity thereof in accordance with the present invention. As can be seen, the top surface 22 includes a roughened surface 24 which results in light 30 incident to the underlayer 20 being diffused such that the intensity of the respective diffused (e.g., scattered) beams 32, are of such low intensity that they do not damage a thin photoresist 36 (FIG. 5) formed over the underlayer 20. As mentioned above, such reduction of reflectivity via the roughened surface 24 mitigates the above-noted problems associated with constructive interference, destructive interference, standing waves and intense scattered beams caused by reflected light.

FIGS. 2–10 illustrate one specific methodology for carrying out the present invention. In FIG. 2, the underlayer 20 is shown formed on a silicon substrate 37. The underlayer 20 has a substantially smooth surface 38. Such a smooth surface 38 will reflect light incident thereto in a manner likely to cause damage to the photoresist 36. However, as will be described in greater detail below, the smooth surface 38 will be roughened or dulled so as to reduce the reflectivity thereof. The underlayer 20 may include any material such as oxide, polysilicon, silicon nitride and aluminum, for example, which are known to have highly reflective characteristics. In the construction of integrated circuits, one or more metallic layers, such as aluminum or titanium, are deposited and subsequently patterned to provide ohmic or Schottky contacts and electrical connections between various circuit elements. It is to be appreciated that the present invention is intended to include any such materials which may serve as an underlayer and where reflectivity of light incident thereto results in damage to an overlying photoresist. Accordingly, semiconductor materials, silicon (including polysilicon, amorphous silicon, compound semiconductors and polycrystalline silicon), other metals (e.g., titanium, titanium alloys, tungsten, tungsten alloys, aluminum alloys, copper, copper alloys) and other reflective materials employed as underlayers in photolithographic processes are intended to fall within the scope of the present invention as defined by the hereto appended claims. The underlayer 20 may be formed by any of a variety of suitable techniques (e.g., chemical vapor deposition (CVD) processes including low pressure chemical vapor deposition (LPCVD) and plasma enhanced chemical vapor deposition (PECVD), melting, sputtering and the like). The thickness of the underlayer 20 may be suitably tailored in accordance with the chosen material(s) and the desired performance characteristics of the resulting structures patterned from the underlayer 20.

Turning now, to FIG. 3, the underlayer 20 is shown undergoing a roughening process 50 (e.g., plasma etch). The roughening process includes using any of magnetic enhanced reactive ion etching (MERIE), electron cyclotron etching (ECR), or conventional reactive ion etching (RIE) methods, for example. According to the present example, a MERIE method is used with a non-reactant gas of at least one of argon (Ar) (5–100 sccm); xenon (5–100 sccm); krypton (5–100 sccm); and helium (5–100 sccm) at a source power level within the range of about 20–500 W, bias power level within the range of about 50–200 W, and pressure within the range of about 3–20 mT. It is to be appreciated that the reactant gas be inert so as to mitigate damage to the underlayer 20. The present invention is intended to include any suitable inert reactant gas or combination of substantially inert reactant gases.

FIG. 4 illustrates the underlayer 20 with a roughened surface 56 complete in relevant part. Next, as illustrated in FIG. 5, the photoresist layer 36 is formed on the roughened underlayer 20. FIG. 6 illustrates the photoresist layer undergoing a patterning step 60. An exposure source (not shown) illuminates selected areas of the photoresist surface through an intervening mask template. Exposure of the photoresist 36 through the photomask causes the image area to become either more or less soluble (depending on the coating) in a particular solvent developer. As the light beam 30 (FIG. 1) cuts through the photoresist 36 to pattern a line for example, the light beam 30 strikes the surface of the underlayer 20. Since the underlayer 20 has the roughened surface 24, the incident light 30 is scattered/diffused such that the scattered/diffused beams 32 (FIG. 1) have an intensity which results in minimal or negligible damage to the photoresist 36. As a result, maintaining integrity of the photoresist 36 is facilitated by the present invention which in turn promotes improved resolution in the photolithographic process.

Figure 7:
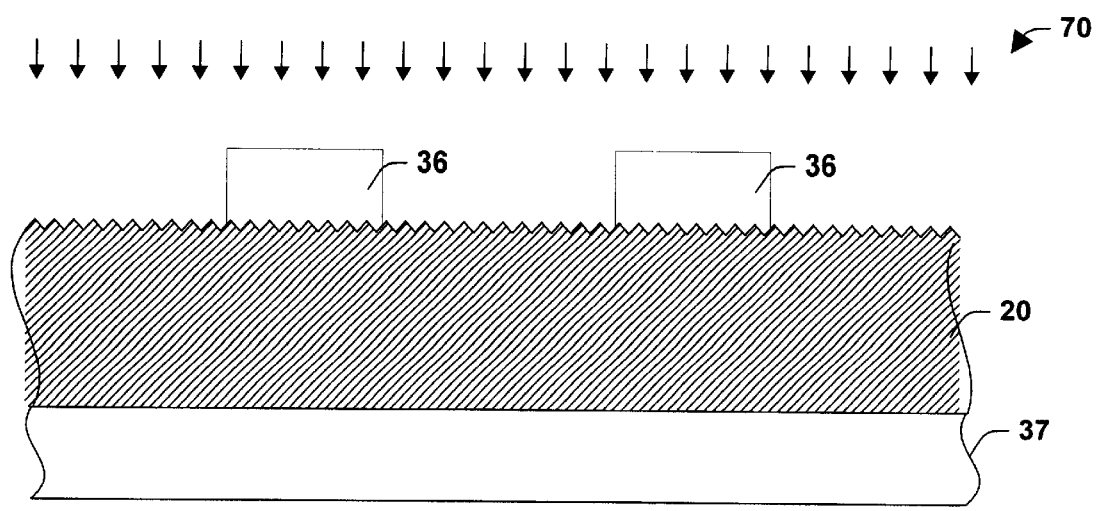
FIG. 7 is a schematic cross-sectional illustration of an etch step being performed on the underlayer to pattern the underlayer material.
Figure 8:
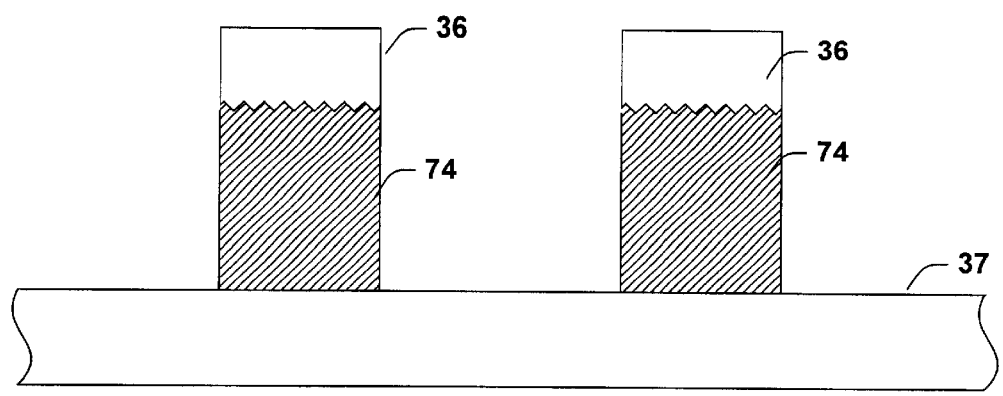
FIG. 8 is a schematic cross-sectional illustration of the patterned underlayer material after the etching step in FIG. 7 is substantially complete.
Figure 9:
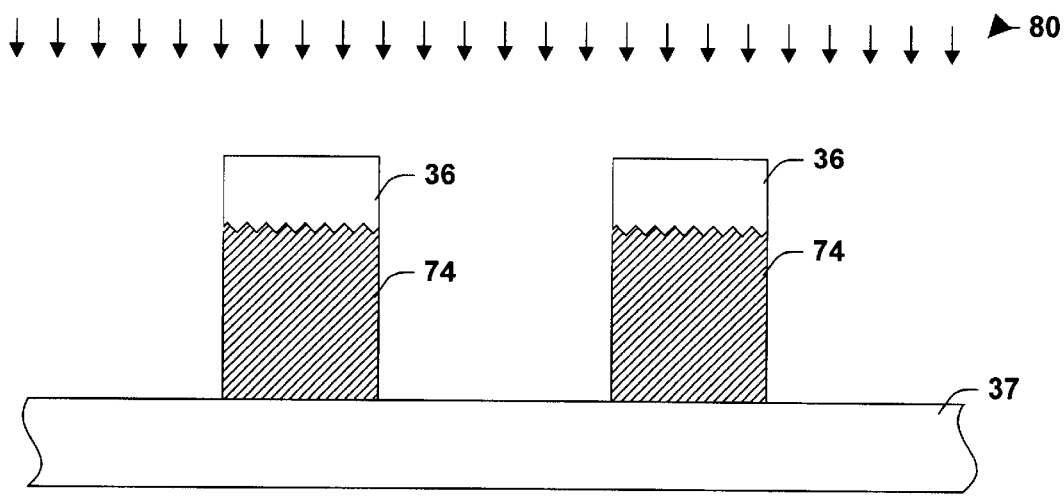
FIG. 9 is a schematic cross-sectional illustration of a stripping process to remove residual photoresist from the patterned underlayer material of FIG. 8.
Figure 10:
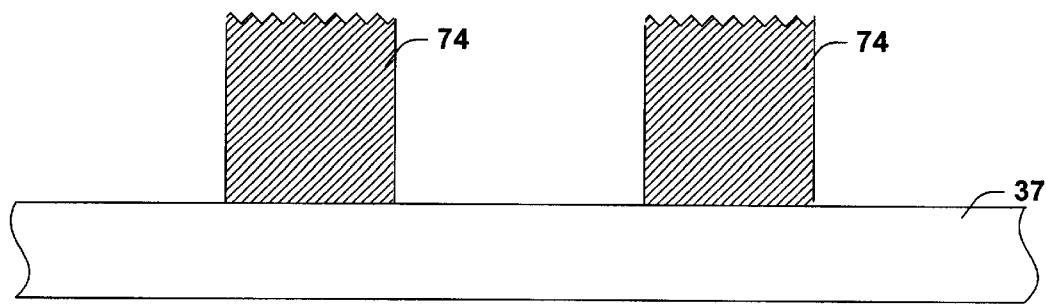
FIG. 10 is a schematic cross-sectional illustration of the patterned underlayer material in accordance with the present invention.

FIG. 7 illustrates an etching step 70 being performed on the underlayer 20 so as to pattern the underlayer 20 by etching away portions thereof not protected by the patterned photoresist 36. FIG. 8 illustrates a patterned underlayer 74 after the etching step 70 has been completed. A stripping/cleaning step 80 is performed in FIG. 9 to remove residual photoresist 36 remaining on the patterned underlayer 74. Any suitable stripping cleaning methodology may be employed to carry out this step 80. FIG. 10 illustrate the patterned underlayer 74 substantially complete in relevant part.

Figure 11:
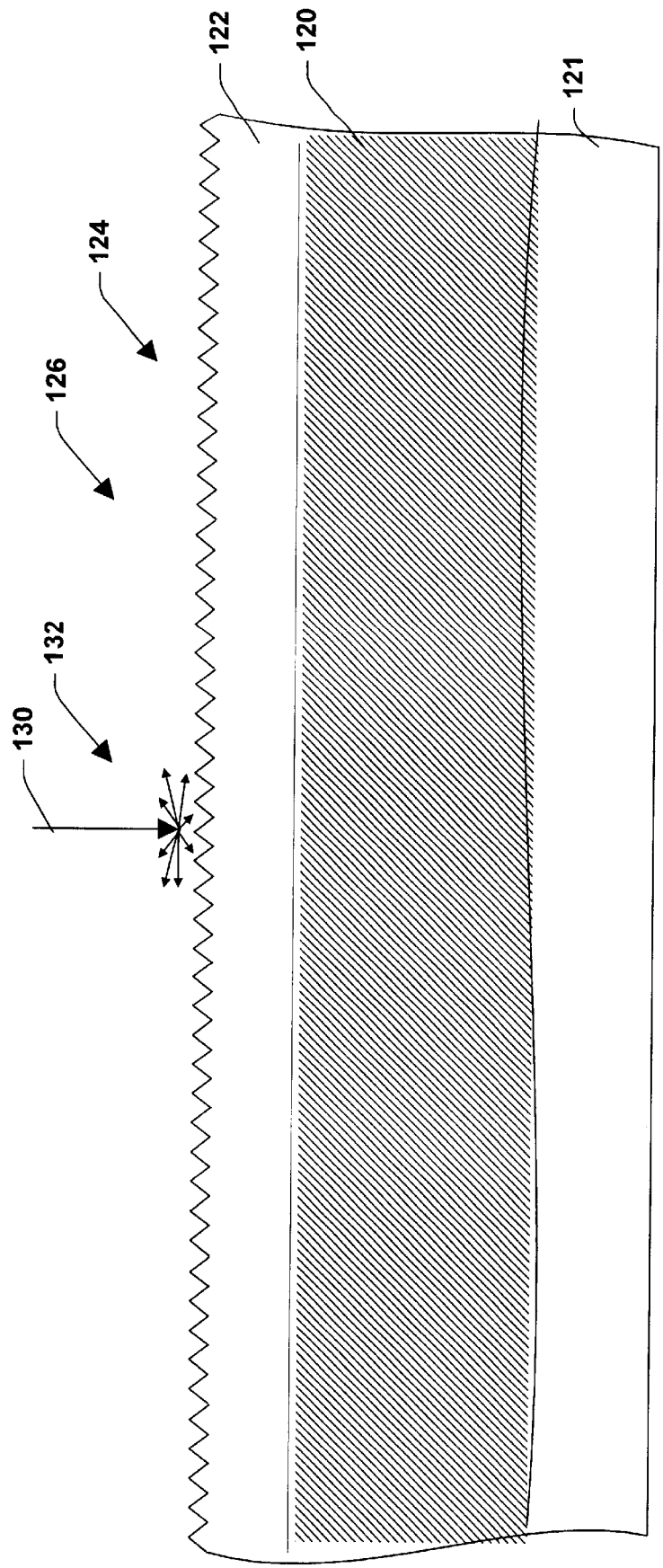
FIG. 11 is a schematic cross-sectional illustration of a portion of an oxide layer with a roughened surface to serve as an anti-reflective coating for an underlayer material in accordance with the present invention.

Turning now to FIGS. 11–21, another embodiment of the present invention is discussed wherein the surface of an oxide layer is roughened so that the oxide layer can serve as an anti-reflective coating for an underlayer. FIG. 11 illustrates an underlayer 120 formed on a silicon substrate 121. An oxide layer 122 is shown formed over the underlayer 120. The surface 124 of the oxide layer 122 is roughened (or dulled) so as to substantially reduce reflectivity thereof in accordance with the present invention. As can be seen, the surface 122 includes a roughened surface 126 which results in light 130 incident to the oxide layer 122 being diffused such that the intensity of the respective diffused (e.g. scattered) beams 132, are of such low intensity that they do not damage a thin photoresist 136 (FIG. 16) formed over the oxide layer 122. As mentioned above, such reduction of reflectivity via the roughened surface 126 mitigates the above-noted problems associated with constructive interference, destructive interference, standing waves and intense scattered beams caused by reflected light.

Figure 12:
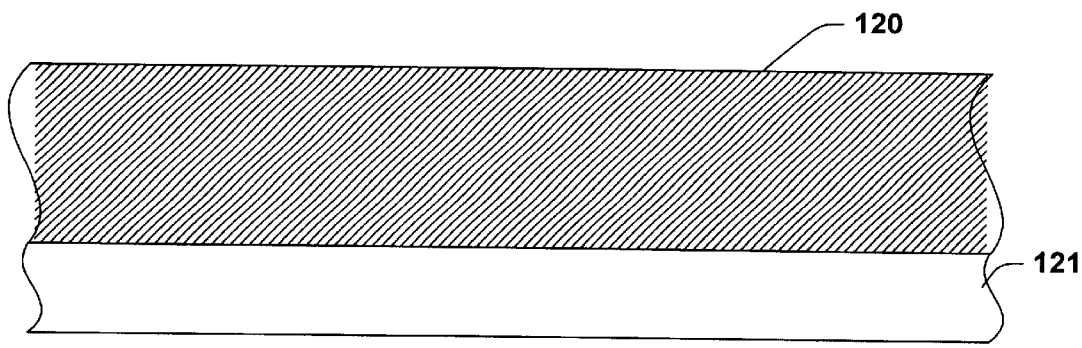
FIG. 12 is a schematic cross-sectional illustration of a reflective underlayer formed on a silicon substrate.

In FIG. 12, the underlayer 120 is shown formed on the silicon substrate 121. The underlayer 120 may include any material such as aluminum and/or titanium, which are known to have highly reflective characteristics. In the construction of integrated circuits, one or more metallic layers, such as aluminum or titanium, are deposited and subsequently patterned to provide ohmic or Schottky contacts and electrical connections between various circuit elements. It is to be appreciated that the present invention is intended to include any such materials which may serve as an underlayer and where reflectivity of light incident thereto results in damage to an overlying photoresist. Accordingly, semiconductor materials, silicon (including polysilicon, amorphous silicon, compound semiconductors and polycrystalline silicon), other metals (e.g., titanium, titanium alloys, tungsten, tungsten alloys, aluminum, aluminum alloys, copper, copper alloys) and other reflective materials employed as underlayers in photolithographic processes are intended to fall within the scope of the present invention as defined by the hereto appended claims. The underlayer 120 may be formed by any of a variety of suitable techniques (e.g., chemical vapor deposition (CVD) processes including low pressure chemical vapor deposition (LPCVD) and plasma enhanced chemical vapor deposition (PECVD), melting, sputtering and the like). The thickness of the underlayer 120 may be suitably tailored in accordance with the chosen material(s) and the desired performance characteristics of the resulting structures patterned from the underlayer 120.

Figure 13:
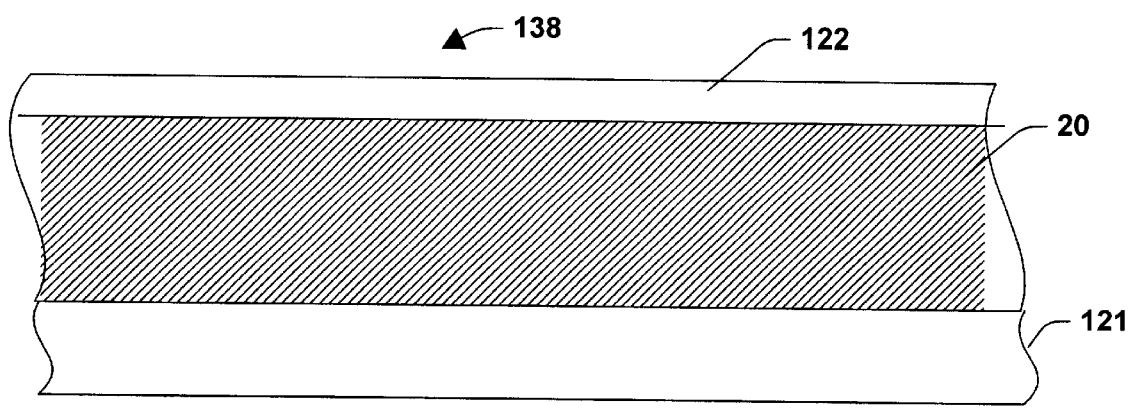
FIG. 13 is a schematic cross-sectional illustration of an oxide layer formed over the underlayer.

In FIG. 13, the oxide layer 122 is formed over the underlayer 120. The oxide layer 122 has a substantially smooth surface 138. Such a smooth surface 138 will reflect light incident thereto in a manner likely to cause damage to the photoresist 136. However, as will be described in greater detail below, the roughened oxide layer 122 will serve as an anti-reflective coating to mitigate damage to the photoresist 136 from reflected light. In the preferred embodiment, the oxide layer 122 includes $SiO_2$, however, any suitable material (e.g., silicon oxy-nitride, oxide-nitride-oxide) may be employed to carry out the present invention. Any suitable technique for forming the oxide layer 122 may be employed such as plasma etch chemical vapor deposition (PECVD), or high density plasma chemical vapor deposition (HDPCVD) techniques.

Figure 14:
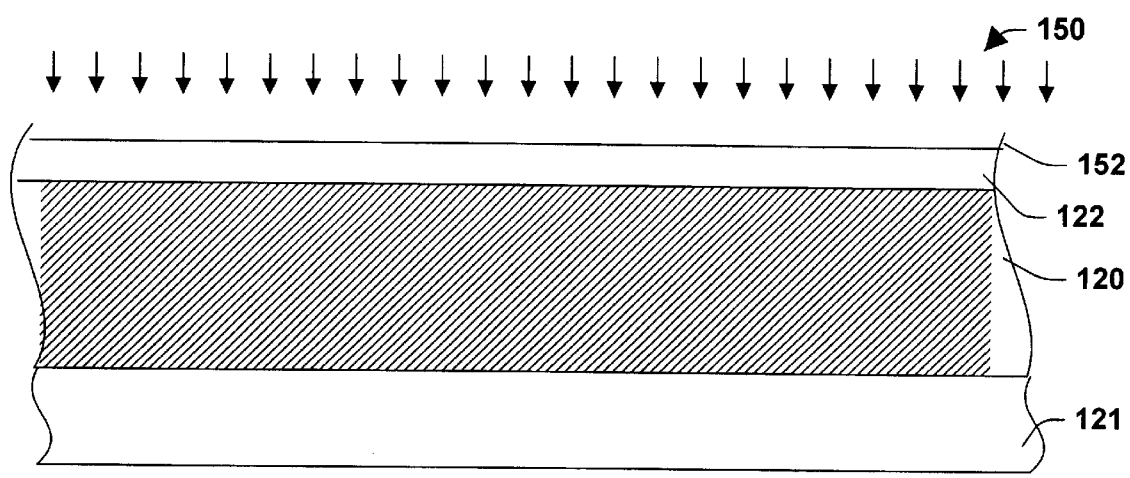
FIG. 14 is a schematic cross-sectional illustration of the oxide layer of FIG. 12 undergoing a roughening process.

Turning now, to FIG. 14, the oxide layer 122 is shown undergoing a roughening process 150, which includes the use of a plasma etch employing an inert reactant gas. According to one specific embodiment of the invention, the roughening process includes: using any of magnetic enhanced reactive ion etching (MERIE), electron cyclotron etching (ECR), or conventional reactive ion etching (RIE) methods, for example. According to the present example, a MERIE method is used with a non-reactant gas of at least one of argon (Ar) (5–100 sccm); xenon (5–100 sccm); krypton (5–100 sccm); and helium (5–100 sccm) at a source power level within the range of about 20–500 W, bias power level within the range of about 50–200 W, and pressure within the range of about 3–20 mT. It is to be appreciated that the reactant gas be inert so as to mitigate damage to the underlayer 20. The present invention is intended to include any suitable inert reactant gas or combination of substantially inert reactant gases. The roughening process 150 may be suitably tailored with respect to granularity so as to result in a desired roughened surface.

Figure 15:
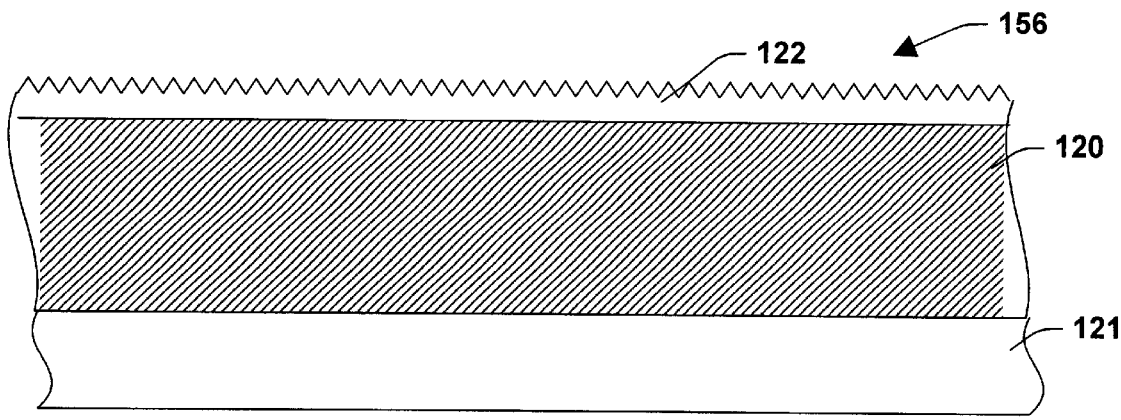
FIG. 15 is a schematic cross-sectional illustration of the oxide layer of FIG. 14 after the roughening process is substantially complete.
Figure 16:
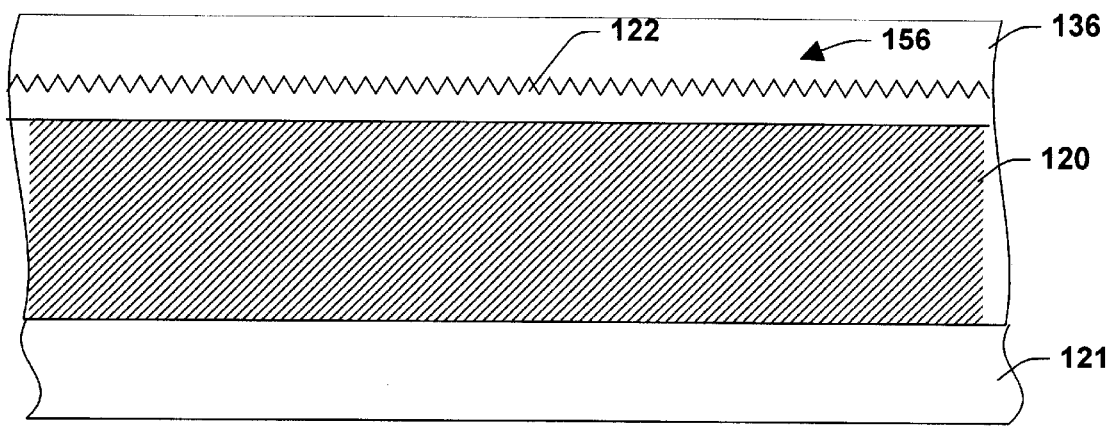
FIG. 16 is a schematic cross-sectional illustration of a photoresist layer formed on the roughened oxide layer of FIG. 15.
Figure 17:
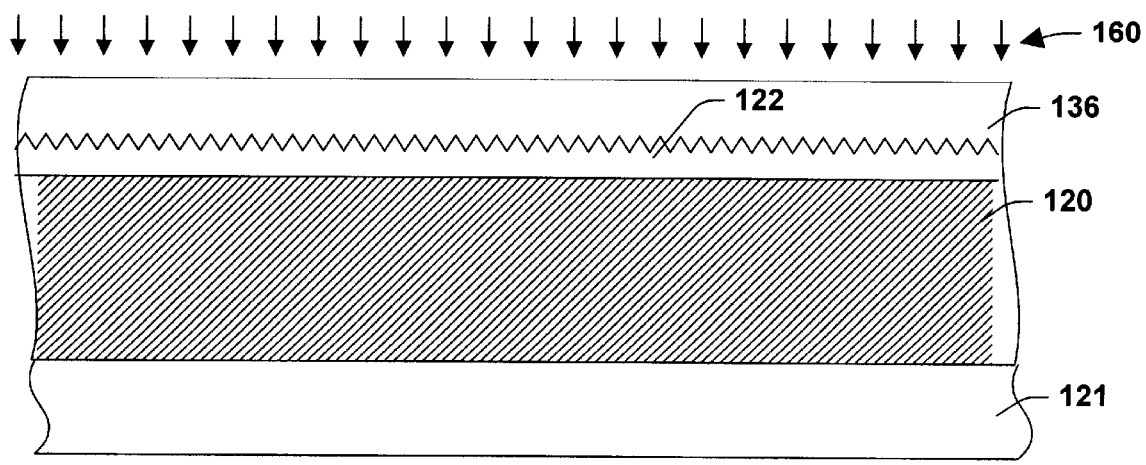
FIG. 17 is a schematic cross-sectional illustration of the photoresist layer of FIG. 16 undergoing a patterning process.

FIG. 15 illustrates the oxide layer 122 with a roughened surface 156 complete in relevant part. Next, as illustrated in FIG. 16, the photoresist layer 136 is formed on the underlayer 120. FIG. 17 illustrates the photoresist layer 136 undergoing a patterning step 160. An exposure source (not shown) illuminates selected areas of the photoresist surface through an intervening mask template. Exposure of the photoresist 136 through the photomask causes the image area to become either more or less soluble (depending on the coating) in a particular solvent developer. As the light beam 130 (FIG. 11) cuts through the photoresist 136 to pattern a line for example, the light beam 130 strikes the surface of the oxide layer 122. Since the oxide layer 122 has the roughened surface 156, the incident light 130 is scattered/diffused such that the scattered/diffused beams 132 (FIG. 11) have an intensity which results in negligible damage to the photoresist 136. As a result, maintaining integrity of the photoresist 136 is facilitated by the present invention which in turn promotes improved resolution in the photolithographic process.

Figure 18:
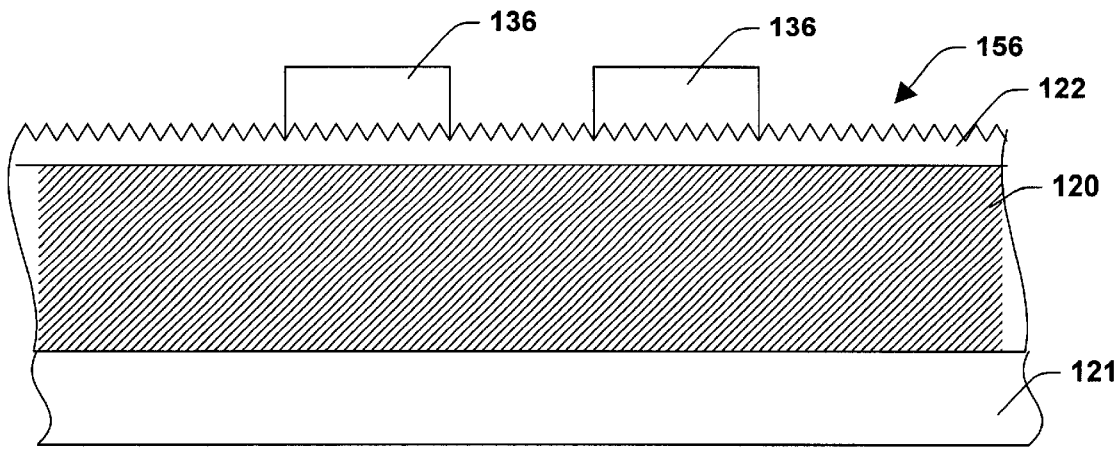
FIG. 18 is a schematic cross-sectional illustration of the patterned photoresist.
Figure 19:
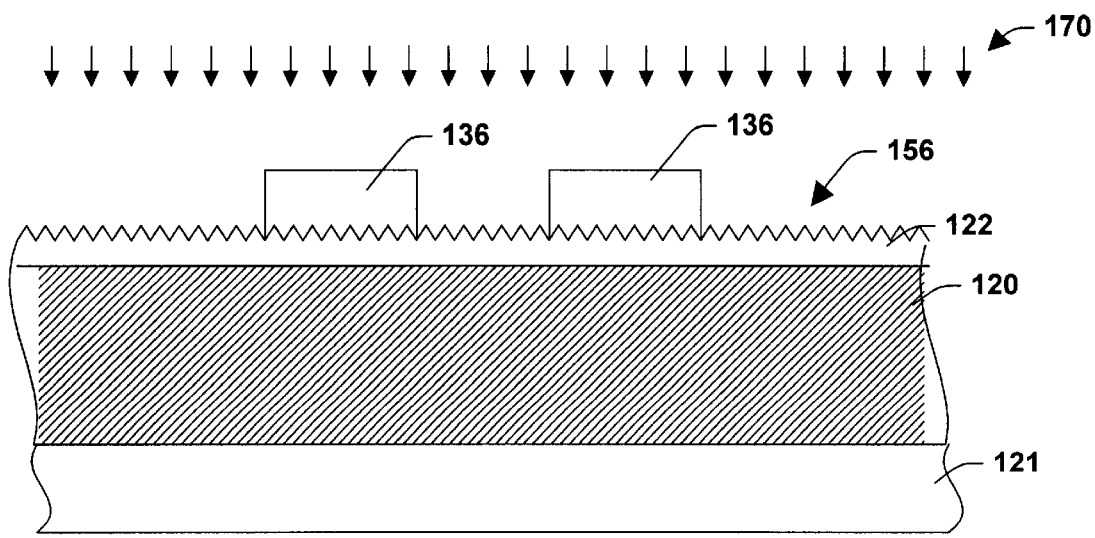
FIG. 19 is a schematic cross-sectional illustration of an etch step being performed on the oxide layer and underlayer to pattern the underlayer material.
Figure 20:
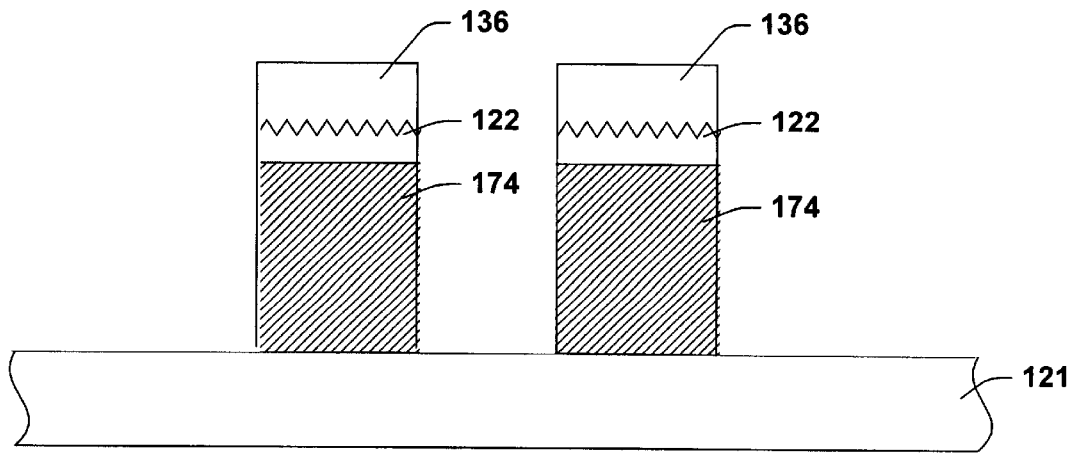
FIG. 20 is a schematic cross-sectional illustration of the patterned underlayer material after the etching step in FIG. 19 is substantially complete.
Figure 21:
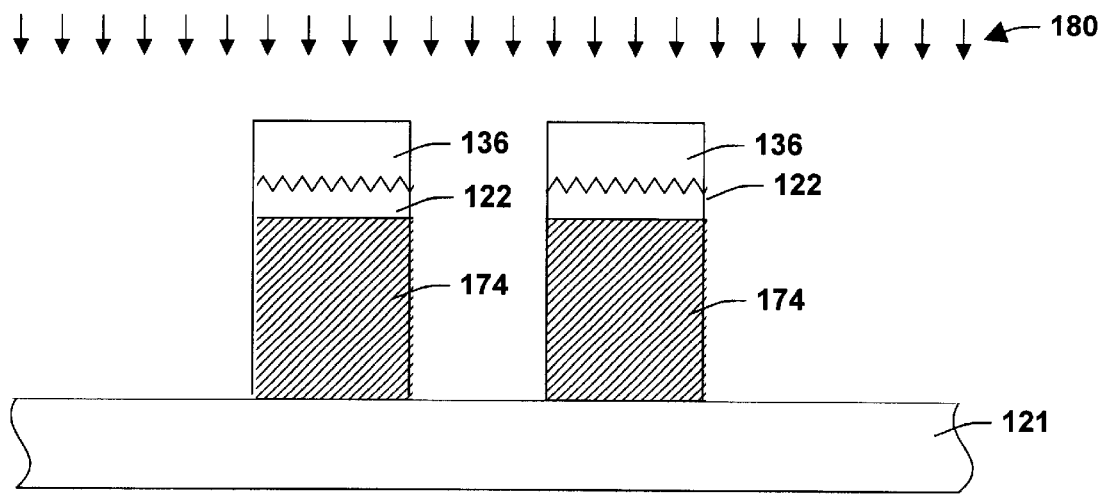
FIG. 21 is a schematic cross-sectional illustration of a stripping process to remove residual photoresist and oxide from the patterned underlayer material of FIG. 20.
Figure 22:
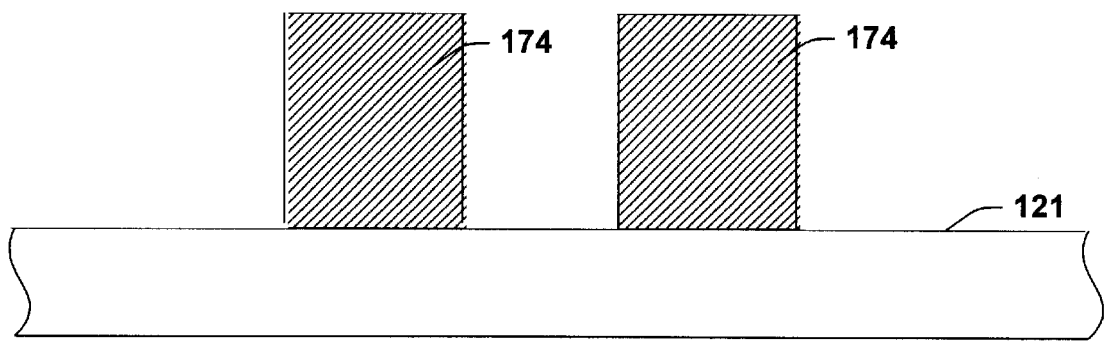
FIG. 22 is a schematic cross-sectional illustration of the patterned underlayer material in accordance with the present invention.

FIG. 18 illustrates a patterned photoresist 136. In FIG. 19, an etching step 170 is performed on the underlayer 120 so as to pattern the underlayer 20 by etching away portions of the underlayer 120 and the oxide layer 122 not protected by the patterned photoresist 136. FIG. 20 illustrates a patterned underlayer after the etching step 170 has been completed. A stripping/cleaning step 180 is performed in FIG. 21 to remove residual photoresist 136 and any oxide 122 remaining on the patterned underlayer 136. Any suitable stripping cleaning methodology may be employed to carry out this step 180. FIG. 21 illustrate the patterned underlayer 174 substantially complete in relevant part. It is to be appreciated that this embodiment provides for a patterned underlayer 136 having a substantially smooth surface as compared to the patterned underlayer 20 of the first embodiment. Accordingly, the present embodiment may be desired in situations where a roughened underlayer is not desired.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method for creating a roughened surface on an oxide material, comprising:

roughening the surface of the oxide material via a plasma etch with a non-reactant gas of at least one of argon (Ar) (5–100 sccm); xenon (5–100 sccm); krypton (5–100 sccm); and helium (5–100 sccm) at a source power level within the range of about 20–500 W, bias power level within the range of about 50–200 W, and pressure within the range of about 3–20 mT, wherein the roughened surface diffuses light incident thereto so as to mitigate damage during exposure to a photoresist subsequently formed on the oxide material.

2. A method for creating a roughened surface on an oxide layer, including the steps of:

forming an oxide layer over an underlayer material;

creating a roughened surface on a surface of the oxide layer via a plasma etch process with a non-reactant gas of at least one of argon (Ar) (5–100 sccm); xenon (5–100 sccm); krypton (5–100 sccm); and helium (5–100 sccm) at a source power level within the range of about 20–500 W, bias power level within the range of about 50–200 W, and pressure within the range of about 3–20 mT;

subsequently forming a photoresist on the oxide layer; and exposing the photoresist to light to form a pattern.

3. The method of claim 2, wherein the roughened surface diffuses light incident to the oxide layer so as to mitigate damage to the photoresist during patterning.

4. A method for creating a roughened surface on an oxide layer serving as an anti-reflective coating for an underlayer, including the steps of:

using a plasma etch process to form the roughened surface, the plasma etch process including using at least one of argon, xenon, krypton and helium as a non-reactant gas, the roughened surface diffusing light incident to the oxide layer so as to mitigate damage during patterning to a photoresist formed on the oxide layer.

* * * * *

UNITED STATES PATENT AND TRADEMARK OFFICE
CERTIFICATE OF CORRECTION

PATENT NO. : 6,245,493 B1
DATED : June 12, 2001
INVENTOR(S) : Bhanwar Singh et al.

Page 1 of 1

It is certified that error appears in the above-identified patent and that said Letters Patent is hereby corrected as shown below:

<u>Column 4,</u>
Line 11, please replace "1Iinse" with -- limiting sense --.
Line 12, please replace "schemtic" with -- schematic --.

Signed and Sealed this

Twenty-fifth Day of December, 2001

*Attest:*

*Attesting Officer*

JAMES E. ROGAN
*Director of the United States Patent and Trademark Office*